(12) United States Patent
Lu

(10) Patent No.: US 7,046,014 B2
(45) Date of Patent: May 16, 2006

(54) ATE MEASUREMENT TECHNIQUE FOR COMPARATOR THRESHOLD VOLTAGE

(75) Inventor: Xiaotang Lu, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/787,952

(22) Filed: Feb. 27, 2004

(65) Prior Publication Data

US 2005/0189950 A1    Sep. 1, 2005

(51) Int. Cl.
*G01R 27/02* (2006.01)
*G01D 1/18* (2006.01)

(52) U.S. Cl. .................................. 324/606; 324/76.13

(58) Field of Classification Search ................ 324/606, 324/603, 601, 600, 76.13; 327/131; 702/108, 702/126

See application file for complete search history.

(56) References Cited

U.S. PATENT DOCUMENTS

| 3,340,469 A | * | 9/1967 | Catherall et al. ........... 324/615 |
| 3,440,566 A | * | 4/1969 | Swanson .................... 332/110 |
| 3,633,043 A | * | 1/1972 | Anthony .................... 327/129 |
| 4,580,088 A | * | 4/1986 | Bloomer .................... 323/238 |
| 5,699,058 A | * | 12/1997 | Yanagisawa et al. ......... 341/13 |
| 6,438,178 B1 | * | 8/2002 | Lysdal et al. ............... 375/317 |
| 2004/0032353 A1 | * | 2/2004 | Kattan ........................ 341/131 |
| 2005/0004775 A1 | * | 1/2005 | Cirkel ........................ 702/119 |

* cited by examiner

*Primary Examiner*—Anjan Deb
(74) *Attorney, Agent, or Firm*—Sterne, Kessler, Goldstein & Fox P.L.L.C.

(57) ABSTRACT

A system and a method for testing a comparator include generating two triangular waveform segments having the same period and different amplitudes, inputting the two triangular waveform segments into a comparator, receiving an output of the comparator, and calculating threshold voltages of the comparator based on the output. A periodic waveform can also be generated with repeating triangular waveform segments having the same period and different amplitudes as input to the comparator.

8 Claims, 5 Drawing Sheets

ATE MEASUREMENT TECHNIQUE FOR COMPARATOR THRESHOLD VOLTAGE

BACKGROUND OF THE INVENTION

1. Field of the Invention

This invention is related to Automatic Test Equipment (ATE) testing and characterization of mixed signal integrated circuits (ICs), and more particularly, to testing thresholds in mixed signal ICs that have a comparator circuit.

2. Related Art

ATE has been widely used for IC production test and characterization. The state-of-art ATE is equipped not only with digital pins with programmable pin electronics operating at high frequency, but also with different frequency range AWG (arbitrary waveform generator) that provides an arbitrary stimulus, and different resolution waveform digitizers to capture a variety of output waveforms. Most of today's mixed-signal ATE also includes certain timing measurement instruments. The comprehensive spectrum of ATE instrumentation makes it a large capital investment, either through purchasing or through leasing. Therefore, ATE test programs need to be developed quickly. Also, test time per device needs to be minimized, while providing maximum test coverage to maintain high IC quality.

With the introduction of so called "systems-on-a-chip", it is common to see analog circuits integrated into almost every contemporary IC. Typical analog IC blocks include power amplifiers, ADCs (analog-to-digital converters), DACs (digital-to-analog converters) and PLLs (phase lock loops). Comparator circuits have been widely applied as well, such as "squelch and signal detect" circuit on 10/100 Ethernet transceivers, DiseqC circuits on satellite set-top box LNB interfaces, etc. "Squelch and Signal Detect" are the analog front end circuitry on the 10/100 Base T Ethernet transceiver. Squelch is used for 10 Base T and Signal Detect used for 100 Base T. Squelch circuits are used to reject signals that are weaker than a threshold level. Signal detect is used to accept incoming signal greater than a predefined threshold as valid data. DiSEqC stands for Digital Satellite Equipment Control, LNB stands for Low Noise Block-Downconverter. A DiseqC circuit on a satellite set-top box LNB interfaces is a discrete component on the satellite dish that blocks all frequency bands except the low frequency video signal. DiSEqC circuits have a programmable threshold to detect incoming signal as a valid video signal or as interference.

The comparator circuit is normally based on a two-terminal operational amplifier. One terminal of the comparator is tied to a programmable voltage source, which provides a threshold voltage for the comparator. When another input terminal is connected to an input voltage higher than the threshold voltage, the comparator output goes HIGH. In the opposite situation, the comparator outputs goes LOW when the input terminal is connected to a voltage lower than the threshold voltage. In order to improve the noise margin, comparator designs normally have a built-in hysteresis, which means that the input will see different threshold voltage when input is increased from LOW to HIGH compared to decreasing it from HIGH to LOW. The difference between the threshold voltages when measured from the two directions, is called a hysteresis voltage.

In general, due to the relative simplicity of comparator design, test and characterization of comparator should be relatively easy. Unfortunately, current ATE test techniques applied to testing and characterization of comparators are relatively awkward and time consuming.

Several test techniques are known for comparator testing. One programmable PMU (Parametric Measurement Unit) can be used to source a DC voltage to the comparator input and another programmable PMU is used to measure the comparator output voltage.

The input DC voltage starts from a low value and gradually increments, until the comparator output goes from LOW to HIGH. The input DC voltage then gradually decreases, until the comparator output turns from HIGH to LOW. Both transition voltages are logged as comparator threshold voltages.

This method requires multiple steps to search for threshold voltages, and is very time consuming. Currently, it is only implemented in characterization testing, while production testing uses only two input levels to perform "go-no go" testing. One relatively high input level is chosen to ensure a comparator output measured at HIGH, and one relatively low input level is selected to ensure a comparator output measured at LOW.

This approach relies on characterization data to pick a HIGH and LOW input level for production testing. It is inevitably imprecise and ignores the comparator hysteresis characteristics.

A sine wave or square wave can be used as an input to the comparator, instead of a DC voltage. Since the comparator output will be a square wave under this stimulus, capturing this output is more difficult than measuring a DC voltage. Typically, certain testability is included with the IC design, which uses one output pin to flag comparator output response, when the input sine wave or square wave amplitude exceeds comparator threshold voltage. In that case, the output pin changes its output from LOW to HIGH to indicate that the comparator is ON. Otherwise, the pin will stay at LOW. Instead of incrementing and decrementing PMU DC voltage, the sine wave or square wave input amplitude can be varied to search for comparator threshold voltage.

This test method has the same shortcoming as the previous method—i.e., long test time. In production testing, the same approach is used to pick two sine wave input amplitudes to perform "go-no go" test.

A ramp wave sourced from ATE AWG can be used as input to the comparator. An up ramp is used to measure comparator threshold voltage from low to HIGH (see FIG. 1), and a down ramp is used to measure threshold voltage from HIGH to LOW (see FIG. 2). The comparator output is captured, and its threshold voltage can be calculated from ramp amplitude and output pulse duty cycle.

Unfortunately, sourcing an ideal ramp wave from the AWG can be a difficult task in certain circumstances. Between the up ramp and the down ramp, there is a fast transition in voltage slope, which requires Vpk change during a short time interval of 1/Fs (here, Fs is the AWG sampling frequency). This poses a problem when AWG sees large capacitive loads. The transition slope elongates to multiples of (1/Fs), and ringing may be seen on the ramp part of the waveform.

For better measurement accuracy, typically a low pass filter is required to smooth out the ramp output sourced from AWG (the ramp output from AWG without filtering is actually a step-ramp). The fast transition slope between ramps, which is the only high frequency component in the ramp spectrum, makes the output ramp distorted when the low pass filter is applied. (FIGS. 1 and 2 show a case when the ramp is 25 Khz, AWG sampling frequency is 1 MS/s, and a low pass filter of 300 Khz is applied).

The non-ideal ramp input means test measurement accuracy is questionable. Triangle wave would be a choice for testing comparator without hysteresis, otherwise the threshold voltage cannot be calculated based on triangle wave amplitude and output pulse width.

SUMMARY OF THE INVENTION

The present invention relates to an ATE measurement technique for comparator threshold voltage that substantially obviates the disadvantages of the related art.

In one aspect of the present invention there is provided a system and a method for testing a comparator that includes generating two triangular waveform segments having the same period and different amplitudes, inputting the two triangular waveform segments into a comparator, receiving an output of the comparator, and calculating threshold voltages of the comparator based on the output. A periodic waveform can also be generated with repeating triangular waveform segments having the same period and different amplitudes as input to the comparator.

Additional features and advantages of the invention will be set forth in the description that follows, and in part will be apparent from the description, or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE FIGURES

The accompanying drawings, which are included to provide a further understanding of the invention and are incorporated in and constitute a part of this specification, illustrate embodiments of the invention and together with the description serve to explain the principles of the invention. In the drawings.

DESCRIPTION OF THE PREFERRED EMBODIMENTS

Reference will now be made in detail to the preferred embodiments of the present invention, examples of which are illustrated in the accompanying drawings.

Figure 1:
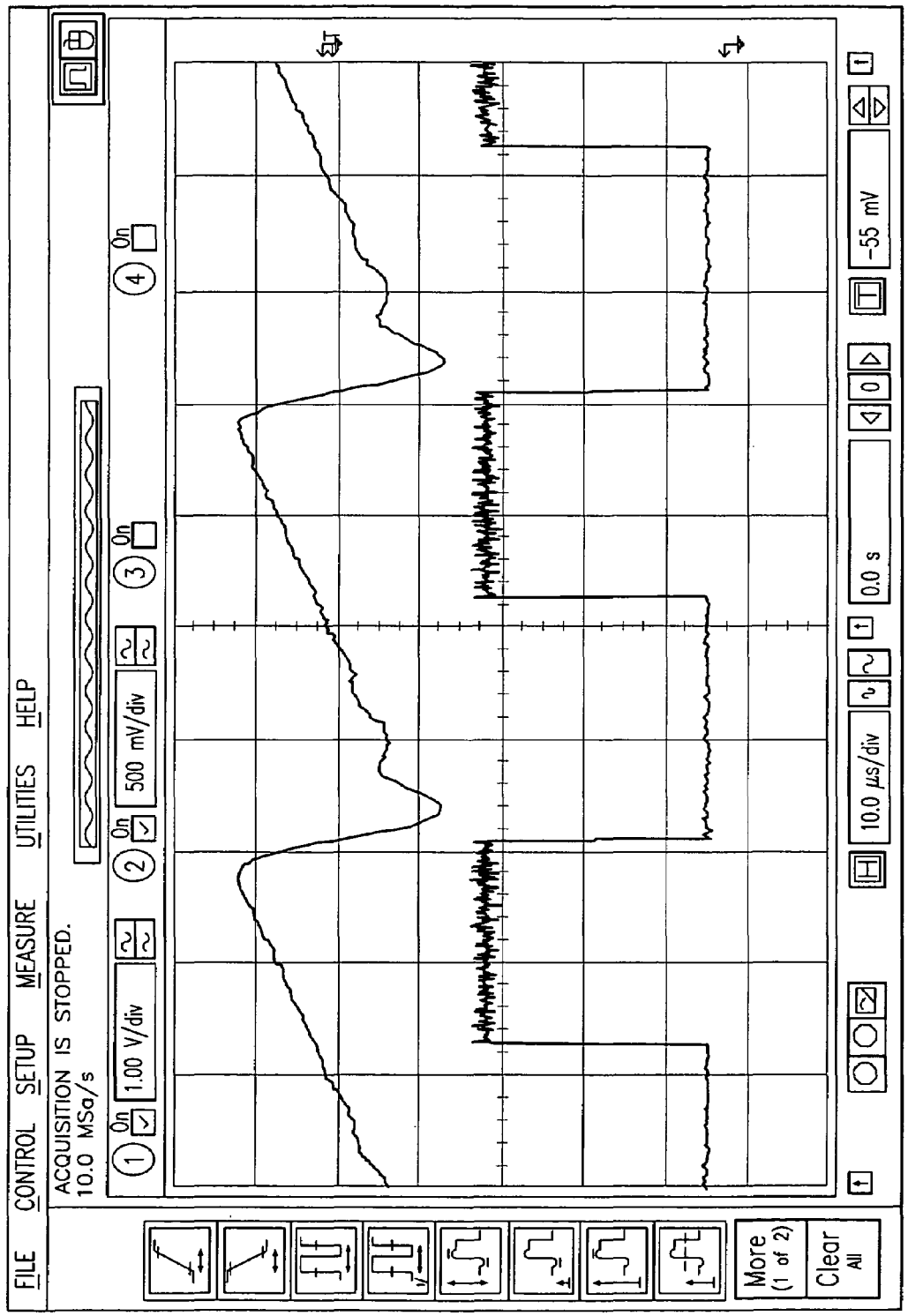
FIG. 1 shows an up ramp is used to measure comparator threshold voltage from low to HIGH.
Figure 2:
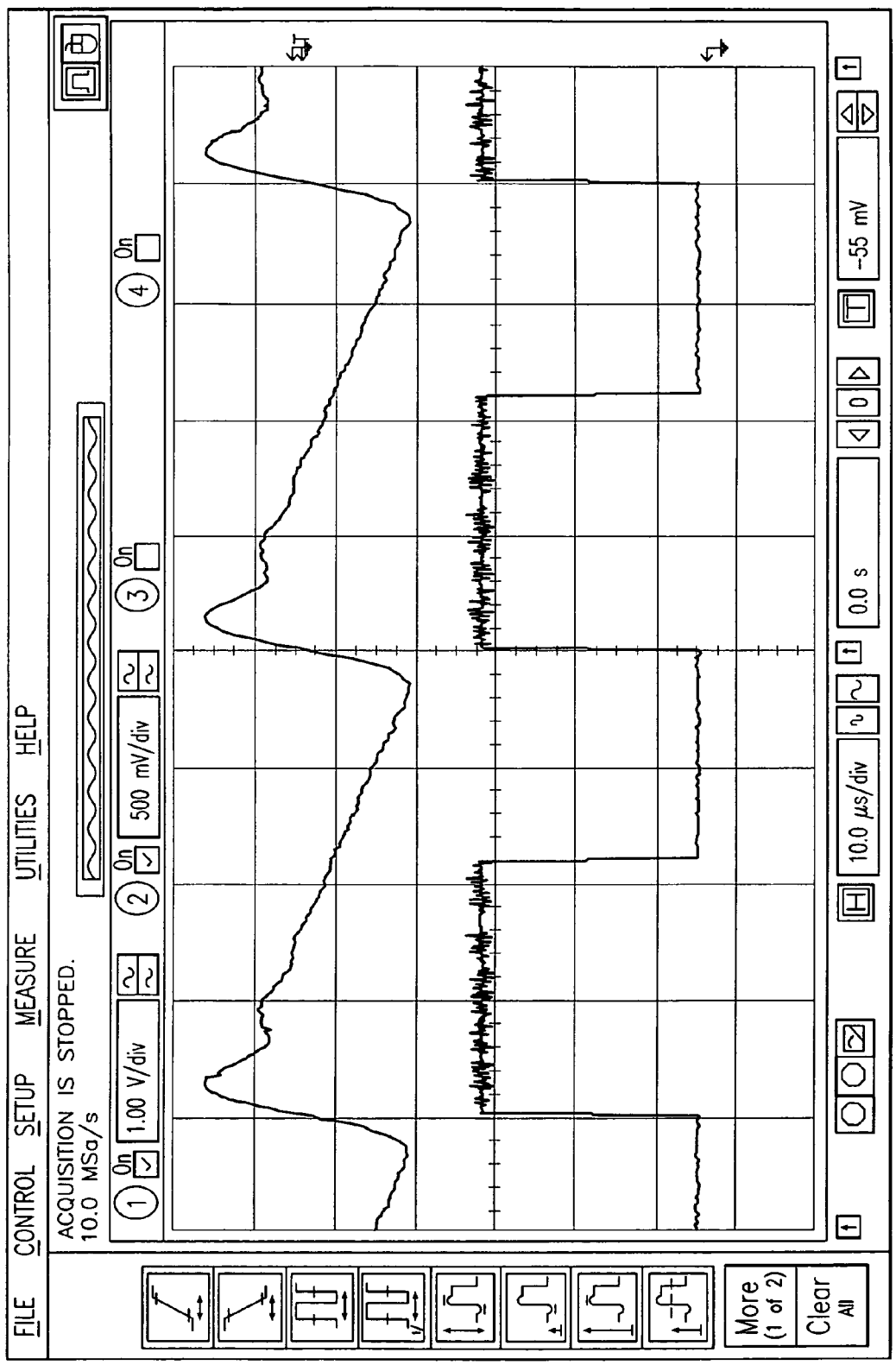
FIG. 2 shows a down ramp is used to measure threshold voltage from HIGH to LOW.
Figure 3:
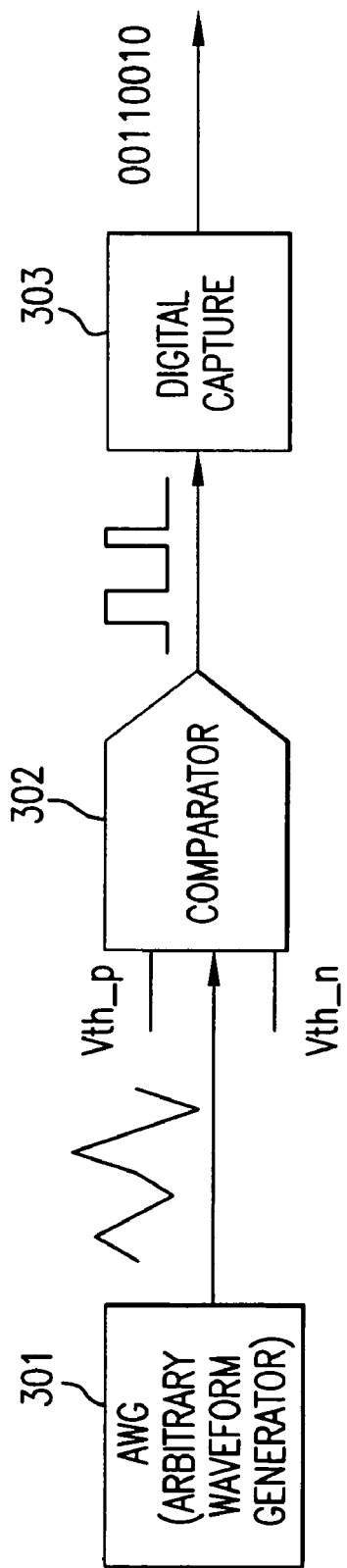
FIG. 3 illustrates an ATE set up according to the present invention.
Figure 4:
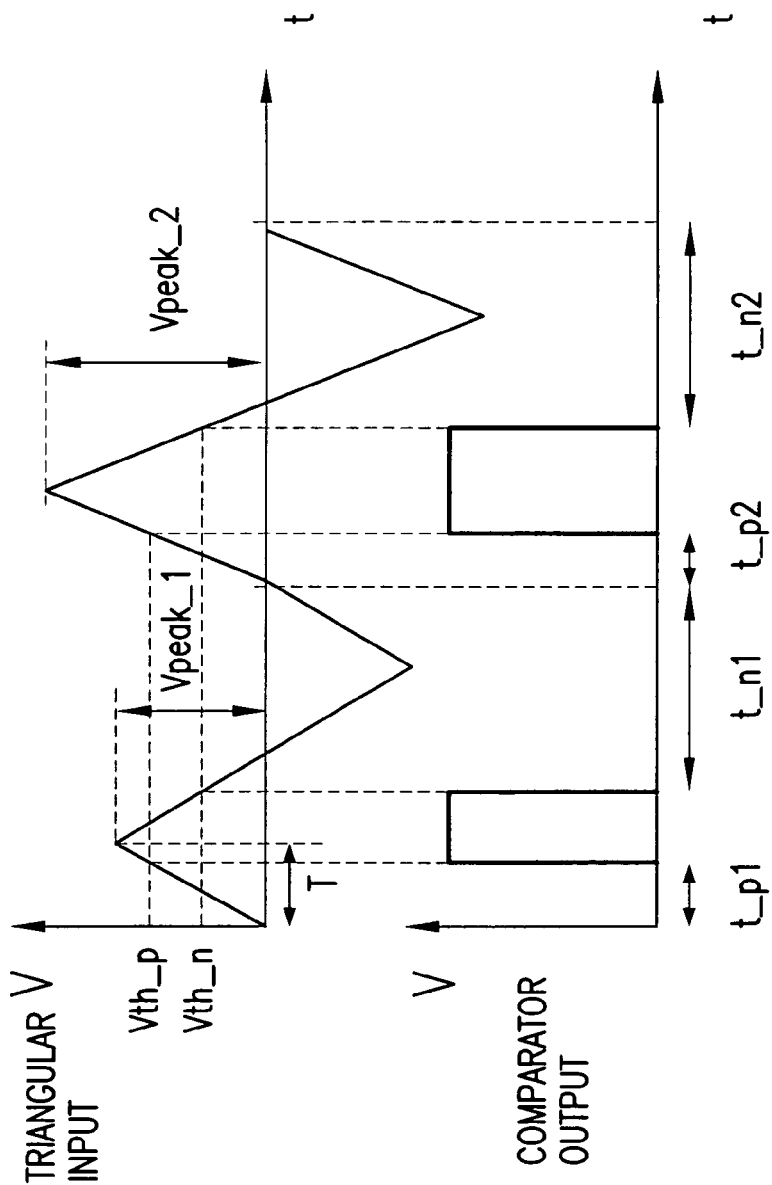
FIG. 4 shows inputs and outputs to a comparator according to an embodiment of the present invention.

The present invention overcomes the long test time required by conventional ATE setups. The invention uses a triangular wave with varying amplitude between two adjacent triangles as a stimulus to comparator input, as shown in FIG. 4. FIG. 3 illustrates an ATE setup according to one embodiment of the present invention. As shown in FIG. 3, an arbitrary waveform generator (AWG) 301 generates a waveform that includes two triangular waveforms back to back, where the two waveforms have different amplitudes but the same wavelength. The waveform is inputted to a comparator 302, captured by a digital capture circuit 303, and is analyzed.

The comparator 302 output (which is squares waves with different pulse width) is captured by the digital capture circuit 303, as noted above. Based on a time difference between the start points of two adjacent output positive edges and two adjacent output negative edges, both positive and negative comparator threshold voltages can be calculated, and thus the hysteresis voltage can be determined.

Thus, the present invention uses triangular wave with varying input amplitude as comparator 302 input. Using a normal triangular wave input for testing comparator with hysteresis references synchronization between the triangular wave input and the comparator 302 output upon digital capture by the circuit 303. The comparator 302 threshold voltage cannot be determined without knowing the exact time when triangular wave reach its peak, dissecting comparator 302 output pulse into two portion and calculating the respective threshold voltage for both LOW to HIGH and HIGH to LOW transitions. However, if the amplitude of two adjacent triangular wave pulses is varied, as described below, the synchronization issue can be easily addressed.

As shown in FIG. 4, with two varying amplitude triangular pulses as input, the comparator 302 outputs two pulses with different pulse width. Starting with Vth_p (threshold voltage from LOW to HIGH transition), Equations 1 and 2 show the proportional relationship between threshold voltage and time duration:

$$\frac{V_{th\_p}}{V_{peak\_1}} = \frac{t\_p1}{T} \quad \text{(Equation 1)}$$

$$\frac{V_{th\_p}}{V_{peak\_2}} = \frac{t\_p2}{T} \quad \text{(Equation 2)}$$

Subtracting Equation 1 from Equation 2, Equations 3 and 4 are obtained:

$$V_{th\_p} * \left(\frac{1}{V_{peak\_2}} - \frac{1}{V_{peak\_1}}\right) = \frac{t\_p2 - t\_p1}{T} = \frac{\Delta t\_p}{T} \quad \text{(Equation 3)}$$

$$V_{th\_p} = \frac{\Delta t\_p}{T} * \left(\frac{V_{peak\_1} * V_{peak\_2}}{V_{peak\_1} - V_{peak\_2}}\right) \quad \text{(Equation 4)}$$

Therefore, the only unknown variable to be calculated, Vth_p, is the start time difference between two adjacent comparator 302 output pulses, which can be easily obtained by subtracting 4*T (the period of one triangular wave) from the time difference between two adjacent pulse positive edge.

The same calculation applies to the threshold voltage from HIGH to LOW, see Equation 5:

$$V_{th\_n} = \frac{\Delta t\_n}{T} * \left(\frac{V_{peak\_1} * V_{peak\_2}}{V_{peak\_1} - V_{peak\_2}}\right) \quad \text{(Equation 5)}$$

The implementation of the proposed measurement test technique on ATE is also straightforward:

Step 1: Create a triangular waveform segment.

Step 2: Create two triangular waves with same period but different amplitude. The up and down ramp should be the symmetric with DC averaged at 0V (non-zero DC inputs could distort the baseline of comparator input). Slow ramp triangular wave and appropriate low pass filter is recommended for better input waveform resolution and measurement accuracy.

Step 3: Capture the output of the comparator 302. An ATE digital capture or error map can be used to capture the comparator 302 output. Two triangular wave periods of capture are required.

Step 4: Calculate the threshold voltages and log them.

Step 5: After shuffling the capture data (the first output data point is always at 0), determine the time point of two LOW to HIGH and two HIGH to LOW transitions. The threshold voltages can be calculated based on the equations above.

An exemplary portion of C code used for threshold voltage measurement is shown below:

defineVpeak_1 500
define Vpeak_2 600
definessize 1000 // ssize equal to twice of triangular wave period divide by vector period
Int get_vth(int cap_data[ ], double &vth_p, double &vth_n, double &vth_hystersis)

be achieved. The triangular waveform also combines both positive ramp and negative ramp in one single waveform, and is faster than ramp method, which would require at least two pattern runs to measure positive and negative transition voltage.

The triangular wave technique provides better measurement accuracy than the ramp test technique. It also has better test repeatability compared with the sine wave method, based on the inventor's experience, especially for comparator at lower threshold voltage settings. It requires much less effort in the simulation environment to bring the comparator output directly to a package pin, rather than enable certain testability feature to use one device pin polarity to flag a comparator that needs to be turned on and off.

With the triangular wave as input, debugging a test pattern converted from simulation test bench can be easily done by probing the comparator output and observing the output waveform on an oscilloscope. To do this, the comparator output with triangular sine wave input can be aligned, and

```
{
    register int      idx;
    int               temp_data[ssize];
    int               t_p1, t_p2, t_n1, t_n2;
    int               delta_p, delta_n;
    // shuffle the capture data to ensure it starts from 0
    while ( cap_data[0] ) {
        for ( idx = 0; idx < ¾ *ssize; idx++ )
            temp_data[idx] = cap_data[idx+1/4*ssize];
        for ( idx=3/4*ssize; idx < ssize; idx++)
            temp_data[idx]    =    cap_data[idx-3/4*ssize];
        for ( idx=0; idx < ssize; idx++ )
            cap_data[idx] = temp_data[idx];
    }
    // find out all transition points
    idx = 0;
    while ( !cap_data[idx])     idx++;    t_p1 = idx;
    while ( cap_data[idx])      idx++;    t_n1 = idx;
    while ( !cap_data[idx])     idx++;    t_p2 = idx;
    while ( cap_data[idx])      idx++;    t_n2 = idx;
    // calculate delta of two positive and negative point difference
    delta_p = t_p2 - t_p1 -ssize/2;
    delta_n = t_n2 - t_n1 -ssize/2;
    // calculate threshold voltage and hystersis
    *vth_p    =    (double)delta_p/(ssize/8)    *    (vpeak_1*vpeak_2/(vpeak_1 - vpeak_2));
    *vth_n    =    (double)delta_n/(ssize/8)    *    (vpeak_1*vpeak_2/(vpeak_1 - vpeak_2));
    *vth_hystersis = *vth_p - *vth_n;
}
```

The present invention overcomes the problem of long test time and poor measurement accuracies of conventional comparator test techniques.

Compared to using DC and sine wave inputs, the proposed technique can obtain all threshold voltages and hysteresis while using a single pattern run, and no threshold voltage search is required. Therefore, production test time is considerably reduced. For a comparator with programmable threshold settings, measuring the threshold voltages at all settings can be done in a single pattern run.

Since a triangular waveform is used instead of a ramp, the ringing and uncertainty in transitions due to the ramp fast slope are eliminated, and better measurement accuracy can both positive and negative threshold voltage can be estimated based on the intercept points of triangular input and comparator output.

Figure 5:
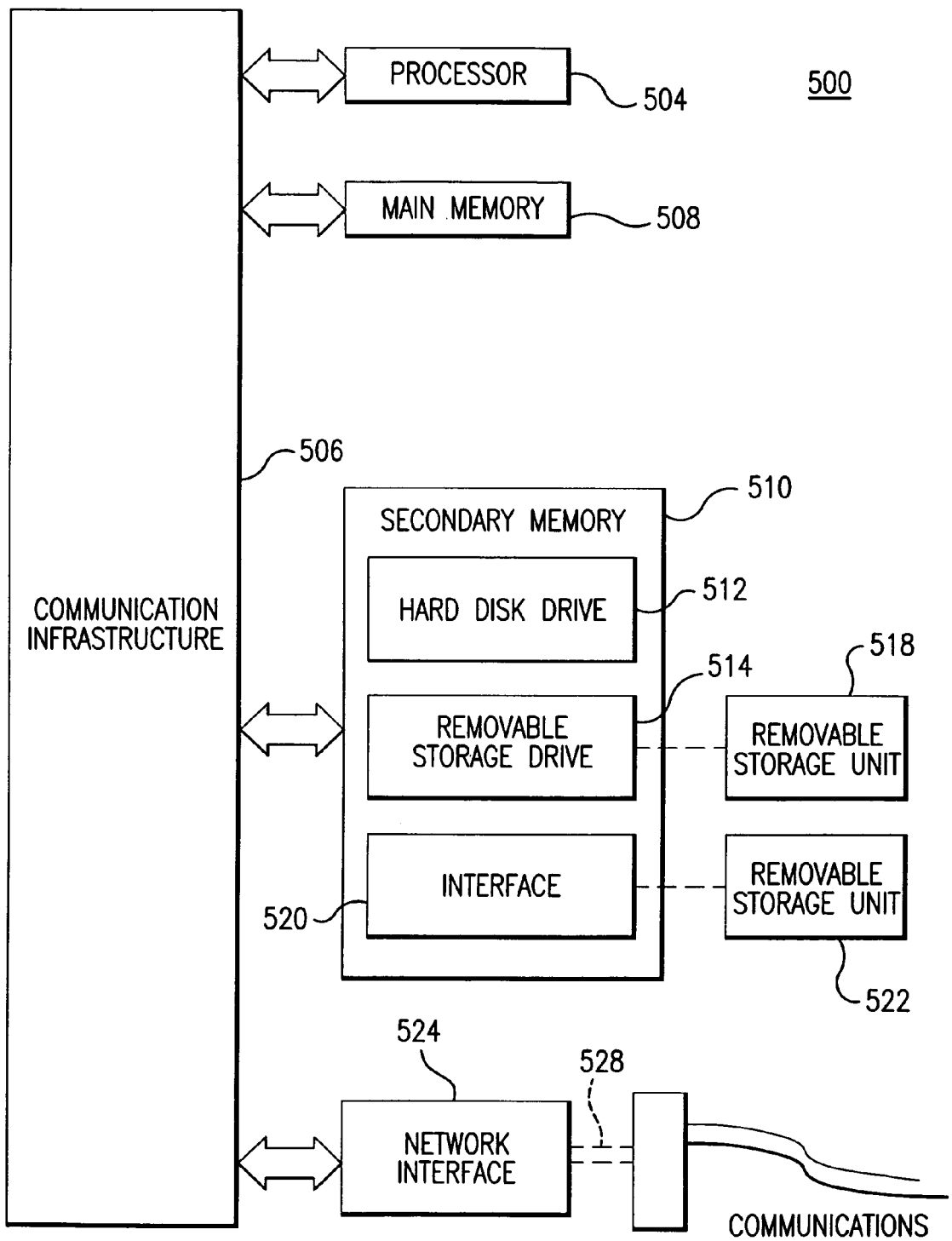
FIG. 5 shows an example of a computer system that may be used as the ATE, or in conjunction with an ATE.

An example of a computer system that may be used as the ATE, or in conjunction with an ATE is illustrated in FIG. 5. The computer system 500 includes one or more processors, such as processor 504. The processor 504 is connected to a communication infrastructure 506, such as a bus or network). Various software implementations are described in terms of this exemplary computer system. After reading this description, it will become apparent to a person skilled in the relevant art how to implement the invention using other computer systems and/or computer architectures.

Computer system 500 also includes a main memory 508, preferably random access memory (RAM), and may also include a secondary memory 510. The secondary memory 510 may include, for example, a hard disk drive 512 and/or a removable storage drive 514, representing a magnetic tape drive, an optical disk drive, etc. The removable storage drive 514 reads from and/or writes to a removable storage unit 518 in a well-known manner. Removable storage unit 518 represents a magnetic tape, optical disk, or other storage medium that is read by and written to by removable storage drive 514. As will be appreciated, the removable storage unit 518 can include a computer usable storage medium having stored therein computer software and/or data.

In alternative implementations, secondary memory 510 may include other means for allowing computer programs or other instructions to be loaded into computer system 500. Such means may include, for example, a removable storage unit 522 and an interface 520. An example of such means may include a removable memory chip (such as an EPROM, or PROM) and associated socket, or other removable storage units 522 and interfaces 520 which allow software and data to be transferred from the removable storage unit 522 to computer system 100.

Computer system 500 may also include one or more communications interfaces, such as communications interface 524. Communications interface 524 allows software and data to be transferred between computer system 500 and external devices. Examples of communications interface 524 may include a modem, a network interface (such as an Ethernet card), a communications port, a PCMCIA slot and card, etc. Software and data transferred via communications interface 524 are in the form of signals 528 which may be electronic, electromagnetic, optical or other signals capable of being received by communications interface 524. These signals 528 are provided to communications interface 524 via a communications path (i.e., channel) 526. This channel 526 carries signals 528 and may be implemented using wire or cable, fiber optics, an RF link and other communications channels. In an embodiment of the invention, signals 528 comprise data packets sent to processor 504. Information representing processed packets can also be sent in the form of signals 528 from processor 504 through communications path 526.

The terms "computer program medium" and "computer usable medium" are used to generally refer to media such as removable storage units 518 and 522, a hard disk installed in hard disk drive 512, and signals 528, which provide software to the computer system 500.

Computer programs are stored in main memory 508 and/or secondary memory 510. Computer programs may also be received via communications interface 524. Such computer programs, when executed, enable the computer system 500 to implement the present invention as discussed herein. In particular, the computer programs, when executed, enable the processor 504 to implement the present invention. Where the invention is implemented using software, the software may be stored in a computer program product and loaded into computer system 500 using removable storage drive 514, hard drive 512 or communications interface 524.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A method for testing threshold voltages, comprising:
   generating a periodic waveform with repeating triangular waveform segments having a common period and differing amplitudes;
   inputting the periodic waveform into a comparator;
   receiving an output of the comparator; and
   calculating threshold voltages of the comparator based on the output.

2. The method of claim 1, wherein each triangular waveform segment in the periodic waveform has an amplitude that is symmetric around 0 volts.

3. A system for testing threshold voltages, comprising:
   a waveform generator generating a periodic waveform with repeating triangular waveform segments having a common period and differing amplitudes;
   a comparator receiving the periodic waveform at one of its inputs; and
   a circuit that calculates threshold voltages of the comparator based on an output of the comparator.

4. The system of claim 3, wherein each triangular waveform segment in the periodic waveform has an amplitude that is symmetric around 0 volts.

5. A system for testing threshold voltages, comprising:
   a waveform generator that generates a periodic waveform with repeating triangular waveform segments having a common period and differing amplitudes into a comparator;
   a digital capture circuit receiving an output of the comparator; and
   means for calculating threshold voltages of the comparator based on the output.

6. The system of claim 5, wherein each triangular waveform segment in the periodic waveform has an amplitude that is symmetric around 0 volts.

7. A system for testing threshold voltages, comprising:
   means for generating a periodic waveform with repeating triangular waveform segments having a common period and differing amplitudes;
   a comparator receiving the periodic waveform at one of its inputs; and
   means for calculating threshold voltages of the comparator based on an output of the comparator.

8. The system of claim 7, wherein each triangular waveform segment in the periodic waveform has an amplitude that is symmetric around 0 volts.

* * * * *